United States Patent [19]
Ishihara et al.

[11] Patent Number: 4,717,586
[45] Date of Patent: Jan. 5, 1988

[54] PROCESS FOR FORMING DEPOSITED FILM

[75] Inventors: Shunichi Ishihara, Ebina; Shigeru Ohno, Yokohama; Masahiro Kanai, Tokyo; Shunri Oda, Tokyo; Isamu Shimizu, Yokohama, all of Japan

[73] Assignee: Canon Kabushiki Kaisha, Tokyo, Japan

[21] Appl. No.: 829,072

[22] Filed: Feb. 13, 1986

[30] Foreign Application Priority Data

Feb. 18, 1985 [JP] Japan .................. 60-29807

[51] Int. Cl.$^4$ ......................... H01L 21/469
[52] U.S. Cl. ..................... 427/39; 437/233; 437/53.1
[58] Field of Search .............. 427/38, 39, 53.1, 86, 427/87; 204/157.15, 157.3, 157.4; 118/719

[56] References Cited

U.S. PATENT DOCUMENTS

| | | | |
|---|---|---|---|
| 3,825,439 | 7/1974 | Tick | 427/87 |
| 3,916,034 | 10/1975 | Tsuchimoto | 427/85 |
| 4,220,488 | 9/1980 | Duchemin et al. | 118/719 |
| 4,434,188 | 2/1984 | Kamo et al. | 427/113 |
| 4,461,783 | 7/1984 | Yamazaki | 427/86 |
| 4,521,447 | 6/1985 | Oushinsky et al. | 427/38 |
| 4,522,663 | 6/1985 | Oushinsky et al. | 427/86 |
| 4,569,697 | 2/1986 | Tsu et al. | 427/86 |
| 4,582,560 | 4/1986 | Sanjurjo | 427/86 |

FOREIGN PATENT DOCUMENTS

| | | | |
|---|---|---|---|
| 0090586 | 10/1983 | European Pat. Off. | 427/39 |
| 59-199035 | 11/1984 | Japan | 427/39 |

*Primary Examiner*—John H. Newsome
*Attorney, Agent, or Firm*—Fitzpatrick, Cella, Harper & Scinto

[57] ABSTRACT

A process for forming a deposited film comprises introducing into a film forming space for forming a deposited film on a substrate an activated species (A) formed by decomposition of a compound containing silicon and a halogen and an activated species (B) formed from a germanium containing compound for film formation which is chemically mutually reactive with said activated species (A) separately from each other, and then permitting the both species to react chemically with each other thereby to form a deposited film on the above substrate.

16 Claims, 4 Drawing Figures

PROCESS FOR FORMING DEPOSITED FILM

BACKGROUND OF THE INVENTION

1. Field of the Invention

This invention relates to a process for forming a deposited film containing germanium, above all a functional film, particularly a deposited film containing amorphous or crystalline germanium to be used for a semiconductor device, photosensitive device for electrophotography, line sensor for image input, image pickup device, etc.

2. Description of the Prior Art

For example, for formation of an amorphous silicon film, the vacuum deposition method, the plasma CVD method, the CVD method, the reactive sputtering method, the ion plating method, the optical and CVD method have been practiced. In general, the plasma CVD method has widely been used and industrialized.

However, for the deposited film constituted of amorphous silicon, there is room left for further improvement in its overall characteristics with respect to electrical properties, optical characteristics, and resistance to fatigue due to environmental conditions and repeated usage. Further, improvement in its production and mass production, including uniformity and reproducibility, is desired.

The reaction process in formation of an amorphous silicon deposited film according to the plasma CVD method is considerably more complicated than the CVD method of the prior art, and several ambiguities existed in the reaction mechanism. Also, there are involved a large number of parameters for formation of the deposited film (e.g. substrate temperature, flow rates and ratios of gases introduced, pressure during film formation, high frequency power, electrode structure, structure of the reaction vessel, gas discharging speed, plasma generation system, etc.). The plasma formed by combination of such a large number of parameters may sometimes become unstable and result in markedly bad affects on the deposited film formed. Besides, the parameters inherent in the film forming device must be chosen for each device, and it has been difficult under the present situation to uniformalize the production conditions. On the other hand, for achieving satisfactory electrical, optical or mechanical characteristics for an amorphous silicon film, it has been deemed best to form an amorphous silicon film according to the plasma CVD method under the present situation.

However, depending on the applied uses of the deposited film, since it is required to achieve a sufficiently large film area, uniformity in film thickness, unformity of film quality, and also to attempt to perform a mass production with reproducibility by a high speed film formation, enormous equipment capital becomes necessary for acquiring suitable mass production devices for forming amorphous silicon deposited films according to the plasma CVD method. Also management items for mass production thereof will become complicated to make the management tolerance narrower. These matters, and also the subtleties involved in adjustment of the devices, have been pointed out as the problems to be improved in the future. On the other hand, in conventional CVD method of the prior art, high temperature is required to be used and no deposited film having practical characteristics could be obtained.

As described above, in formation of amorphous silicon films, it has earnestly been desired to develop a formation process which can perform mass production by means of a low cost device while maintaining practical characteristics and uniformity. These considerations may also be applicable to other functional films such as silicon nitride film, silicon carbide film, silicon oxide film, etc.

SUMMARY OF THE INVENTION

The present invention provides a novel process for formation of a deposited film which removes the drawbacks of the plasma CVD method as described above and also uses no formation method of the prior art.

An object of the present invention is to provide a process for forming a deposited film which is suitable for enlargement of the film and can easily accomplish improvement in productivity and mass production of the film, while attempting to improve the characteristics of the film formed, the film forming speed and reproducibility, and also the uniformity in film quality.

According to the present invention, there is provided a process for forming a deposited film, which comprises introducing into a film forming space for forming a deposited film on a substrate an activated species (A) formed by decomposition of a compound containing silicon and a halogen and an activated species (B) formed from a germanium containing compound for film formation which is chemically mutually reactive with said activated species (A) separately from each other, and then permitting the both species to react chemically with each other thereby to form a deposited film on the above substrate.

DETAILED DESCRIPTION OF THE PREFERRED EMBODIMENTS

Figure 1:
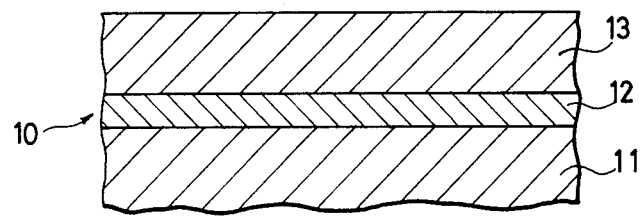
FIG. 1 is a schematic sectional view for illustration of a construction example of an image forming member for electrophotography produced by use of the process of the present invention.

In the process of the present invention, since no plasma is excited in the deposition space for forming a deposition film, the deposited film formed is free from the bad affects of etching action or other actions such as abnormal discharging action, etc.

One of the points of the process of the present invention which is different from the CVD process of the prior art is the use of activated species which are previously activated in a space different from the film forming space (hereinafter referred to as "activation space"). By doing so, the film forming speed can be dramatically increased. In addition, the substrate temperature can be lowered to a great extent, whereby deposited films with stable film quality can be provided commercially in a large amount and at low cost.

The term activated species as herein employed refers to those having the action of promoting formation of deposited films by causing chemical mutual actions with the above deposited film or excited decomposed products thereof, thereby imparting energy or causing chemical reactions to occur. Thus, the activated species may either contain the constituent elements which become the constituent elements constituting the deposited film to be formed or contain no such constituent element.

In the present invention, the activated species (A) from the activation space (A) should preferably be selected as desired from those having the life of 0.1 sec. or larger, more preferably 1 sec. or longer, optimally 10 sec. or longer, from the standpoint of productivity and easiness in handling.

The germanium containing compound introduced into the activation space (B) to be used in the present invention preferably is already gaseous before introduction into the activation space (B), or is introduced under gaseous state. For example, when employing a liquid compound, the compound can be gasified by means of a gasifying device connected to the source for supplying the compound before introduction into the activation space (B).

As the above germanium containing compound, there may be employed inorganic or organic germanium containing compounds having hydrogen, halogen or hydrocarbon groups bonded to germanium, as exemplified by organic germanium compounds such as chain or cyclic hydrogenated germanium represented by $Ge_aH_b$ (a is an integer of 1 or more, $b=2a+2$ or $2a$), polymers of the hydrogenated germanium, compounds in which a part or all of the hydrogen atoms in the above hydrogenated germanium are substituted by halogen atoms, compounds in which a part or all of the hydrogen atoms in the above hydrogenated germanium compound are substituted by organic groups such as alkyl groups, aryl groups, etc. and halogen atoms, if desired, and other germanium compounds.

Specifically, there may be included, for example, $GeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6GeF_6$, $Ge(CH_3)_4$, $Ge(C_2H_5)_4$, $Ge(C_6H_5)_4$, $CH_3GeH_3$, $(CH_3)_2GeH_2$, $(CH_3)_3GeH$, $(C_2H_5)_2GeH_2$, $Ge(CH_3)_2F$, $GeF_2$, $GeF_4$, $GeS$, etc. These germanium compounds may be used either alone or as a combination of two or more compounds.

In the present invention, as the compound containing silicon and halogen to be introduced into the activation space (A), there may be employed, for example, chain or cyclic silane compounds of which hydrogen atoms are partially or wholly substituted by halogen atoms, typically chain silicon halides represented by $Si_uY_{2u+2}$ (u is an integer of 1 or more, Y is at least one element selected from F, Cl, Br and I) and cyclic silicon halides $Si_vY_{2v}$ (v is an integer of 3 or more, and Y has the same meaning as defined above), chain or cyclic compounds represented by $Si_uH_xY_y$ (u and Y have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and the like.

For forming the activated species (A), in addition to the above compounds containing silicon and halogen, other silicon compounds such as single substance of silicon, etc., hydrogen, a halogen containing compound (e.g. $F_2$ gas, $Cl_2$ gas, gasified $Br_2$, $I_2$, etc.) may be used in combination.

In the present invention, as the method for forming activated species (A) and (B) in the activation spaces (A) and (B), respectively, there may be employed various activation energies such as electrical energies, increading microwave, RF, low frequency, DC, etc., heat energies such as heater heating, IR-ray heating, etc., photoenergy, etc. in view of respective conditions and the device.

By application of activated energy such as heat, light and discharging on the compounds as described above in an activation space, the activated species (A) can be formed.

In the present invention, the proportion in amount of the above activated species (A) to the activated species (B) in the film forming species may suitably be determined depending on the depositing conditions, the kind of the activated species, etc., but may preferably be 10:1 to 1:10 ratio in inflow, more preferably 8:2 to 4:6.

In the present invention, as the starting materials other than germanium containing compounds for film formation, it is possible to introduce into the chamber for film formation hydrogen gas, a halogen compound (e.g. $F_2$ gas, $Cl_2$ gas, gasified $Br_2$, $I_2$, etc.), an inert gas such as argon, neon, etc. or a silicon containing compound, carbon containing compound and the like as the starting material for formation of a deposited film. When a plurality of these starting gases are to be employed, they can be previously mixed before introduction into the film forming space, or alternatively these starting gases can individually be supplied from feeding sources independent of each other to be introduced into the film forming space.

As the silicon containing compound to be introduced into the activation space (B), there may be employed most of the compounds which can be activated by the action of an activation energy such as light, heat, electricity, etc. to form efficiently activated species (B). Among them, there may be employed effectively the so-called silicon compounds, for example, the compounds containing silicon as the cationic component. Such silicon containing compounds may include silanes and siloxanes having hydrogen, halogen and hydrocarbon groups bonded to silicon. Above all, chain and cyclic silane compounds, or these chain and cyclic silane compounds of which hydrogen atoms are substituted partially or wholly by halogen atoms are preferred.

Specifically, there may be included, for example, straight-chain silane compounds represented by $Si_pH_{2p+2}$ (p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc.; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc.; these straight-chain or branched chain compounds in which a part or all of the hydrogen atoms are substituted by halogen atoms; cyclic silane compounds represented by $Si_qH_{2q}$ (q is an integer of 3 or more, preferably 3 to 6) such as $Si_3H_6$, $Si_4H_8$, $Si_5H_{10}$, $Si_6A_{12}$, etc.; the cyclic silane compounds in which a part or all of the hydrogen atoms are substituted by other cyclic silanyl groups and/or chain silanyl groups. Examples of the above silane compounds in which a part or all of the hydrogen atoms are substituted by halogen atoms may include halo-substituted chain or cyclic silane compounds represented by $Si_rH_sX_t$ (X is a halogen atom, r is an integer of 1 or more, preferably 1 to 10, more preferably 3 to 7, $s+t=2r+2$ or $2r$) such as $SiH_3F$, $SiH_3Cl$, $SiH_3Br$, $SiH_3I$, etc. These compounds may be used either alone or as a combination of two or more compounds.

As the carbon containing compound to be introduced into the activation space B, there may be employed preferably gaseous or readily gasifiable compounds selected from among chain or cyclic saturated or unsaturated hydrocarbon compounds, organic compounds containing carbon and hydrogen as the main constituent atoms and otherwise at least one of silicon, halogen, sulphur as constituent atoms, and organic silicon compounds containing hydrocarbon groups as constituent components. Among them, as hydrocarbon compounds, there may be included saturated hydrocarbons having 1 to 5 carbon atoms, ethylenic hydrocarbons having 2 to 5 carbon atoms, acetylenic hydrocarbons having 2 to 4 carbon atoms, including specifically, as saturated hydrocarbons methane ($CH_4$), ethane ($C_2H_6$), propane ($C_3H_8$), n-butane ($n-C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc.

Organic silicon compounds may include $(CH_3)_4Si$, organochlorosilanes such as $CH_3SiCl_3$, $(CH_3)_2SiCl_2$, $(CH_3)_3SiCl$, $C_2H_5SiCl_3$, etc., organochlorofluorosilanes such as $CH_3SiF_2Cl$, $CH_3SiFCl_2$, $(CH_3)_2SiFCl$, $C_2H_5SiF_2Cl$, $C_2H_5SiFCl_2$, $C_3H_7SiFCl$, $C_3H_7SiFCl_2$, etc. organodisilazanes such as $[(CH_3)_3Si]_2$, $[(C_3H_7)_3Si]_2$.

These carbon containing compounds may be used either alone or as a combination of two or more compounds.

Also, the deposited film formed according to the present invention can be doped with an impurity element during or after the film formation. As the impurity element to be used, there may be employed, as p-type impurity, an element belonging to the group IIIA of the periodic table such as B, Al, Ga, In, Tl, etc. and, as n-type impurity an element belonging to the group VA of the periodic table such as P, As, Sb, Bi, etc. as suitable ones. Particularly, B, Ga, P, Sb, and the like are most preferred. The amount of the impurity to be used for doping may be determined suitably depending on the desired electrical and optical characteristics.

As the compound containing such an impurity element as the component, it is preferable to select a compound which is gaseous under normal temperature and normal pressure, or gaseous at least under the conditions for the activation and can be readily gasified by a suitable gasifying device. Such compounds may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $SbF_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity element may be used either singly or as a combination of two or more compounds.

The substances for introduction of impurities may be introduced into the activation space (A) and/ or the activation space (B) together with the respective substances for formation of the activated species (A) and the activated species (B) to be activated therein, or alternatively activated in a third activation space (C) separated from the activation space (A) and the activation space (B). The substance for introduction of impurity can be employed by selecting suitably the activation energy as described above. The activated species (PN) formed by activation of the substance for introduction of impurity may be previously mixed with the activated species (A) and/or the activated species (B) before introduction into the film forming space or independently introduced into the film forming space.

Next, the present invention is described by referring to a typical example of the image forming member for electrophotography formed by the process of the present invention.

FIG. 1 is a schematic sectional view for illustration of the construction example of a typical photoconductive member obtained by the present invention.

The photoconductive member 10 shown in FIG. 1 is appliable as an image forming member for electrophotography, and has a layer constitution consisting of an intermediate layer 12 which may optionally be provided and a photosensitive layer 13 provided on a substrate 11 for photoconductive member.

In the preparation of the photoconductive member 10, the intermediate layer 12 and/or the photosensitive member 13 can be prepared according to the process of the present invention. Further, when the photoconductive member 10 has as a protective layer provided for the purpose of protecting chemically or physically the surface of the photosensitive layer 13, or a lower barrier layer and/or an upper barrier layer provided for improving dielectric strength, these layers can also be prepared according to the process of the present invention.

The substrate 11 may be either electroconductive or insulating. As the electroconductive substrate, there may be mentioned metals such as NiCr, stainless steel, Al, Cr, Mo, Au, In, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treament has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) etc. thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 10 in FIG. 1 is to be used as the light-receiving member for electrophotography, it may desirably be formed into an endless belt or a cylinder for use in continuous high speed copying.

For example, the intermediate layer 12 has the function of impeding effectively inflow of the carriers from the side of the substrate 11 into the photosensitive layer 13 and permitting readily passage of the photocarriers, formed by irradiation of electromagnetic wave in the photosensitive layer 13 and migrating toward the side of the substrate 11, from the side of the photosensitive layer 13 to the side of the substrate 11.

The intermediate layer 12 is constituted of an amorphous germanium containing optionally silicon (Si), hydrogen (H), halogen (X), etc. as constituent atoms (hereinafter written as "A—Ge(SI, H, X)") or an amorphous material constituted of silicon (Si) as the matrix containing optionally hydrogen (H) and/or halogen (X) (hereinafter written as "A—Si(H,X)") and at the same time contains, for example, a p-type impurity such as B or a n-type impurity such as P as the substance for controlling electroconductivity.

In the present invention, the content of the substance for controlling conductivity such as B, P, etc. contained in the intermediate layer 12 may preferably be 0.001 to $5 \times 10^4$ atomic ppm, more preferably 0.5 to $1 \times 10^4$ atomic ppm, optimally 1 to $5 \times 10^3$ atomic ppm.

In the case of forming an intermediate layer 12 which is similar to or the same in constituents as the photosensitive layer 13, up to formation of the photoconductive layer 13 can continuously be performed subsequent to formation of the intermediate layer 12. In that case, as the starting material for formation of the intermediate layer, the activated species (A) formed in the activation space (A), the gaseous germanium containing compound, optionally together with hydrogen, halogen, silicon containing compounds, inert gases, carbon compounds and activated species formed from gases of compound containing impurity element as the component etc., may be introduced respectively separately into the film forming space, in which the substrate 11 is placed, and the intermediate layer 12 may be formed on the above substrate 11 by causing chemical reactions to occur.

The compound containing silicon and halogen capable of forming activated species (A) by introduction into the activation space (A) during formation of the intermediate layer 12 is desirably one selected from among the compounds as mentioned above which can form readily activated species such as, for example, SiF$_2$* by the action of the activation energy as described above.

The intermediate layer 12 has a layer thickness preferably of 30 Å to 10 $\mu$, more preferably 40 Å to 8 $\mu$, optimally 50 Å to 5 $\mu$.

The photosensitive layer 13 is constituted of, for example, an amorphous silicon A-Si(H,X,Ge) containing optionally hydrogen, halogen, germanium, etc. as constituent atoms or an amorphous germanium A-Ge(H,X) containing optionally hydrogen and halogen as constituent atoms and has both functions of the charge generation function of generating photocarriers by the irradiation of laser beam and the charge transporting function of transporting said charges.

The photosensitive layer 13 has a layer thickness preferably of 1 to 100 $\mu$, more preferably 1 to 80 $\mu$, optimally 2 to 50 $\mu$.

The photosensitive layer 13 is made of a non-doped A-Si(H,X,Ge) or A—Ge(H,X) layer, but it may also contain a substance for controlling conductivity characteristic with a polarity different from the polarity of the substance for controlling conductivity characteristic contained in the intermediate layer 12 (e.g. n-type), if desired, or a substance of the same polarity may be contained therein, when the practical amount contained in the intermediate layer 12 is much, in an amount by far smaller than said amount.

Formation of the photosensitive layer 13 may be practiced, similarly as in the case of the intermediate layer 12, by introducing a compound containing silicon and halogen into the activation space (A), decomposing these under a high temperature or exciting these through the action of discharging energy or light energy to form activated species (A) and introducing said activated species into the film forming space.

Also, separately, silicon containing gaseous compound and germanium containing gaseous compound, optionally together with hydrogen, a halogen compound, an inert gas, a carbon containing compound, a gas of a compound containing an impurity element as the component, etc., are introduced into the activation chamber (B), activated by use of the activation energy as described above to form activated species (B), etc., and said activated species (B) are introduced into the film forming space. The activated species (A) and the activated species (B) thus introduced undergo a chemical reaction to form an intermediate layer on the above substrate 11.

Figure 2:
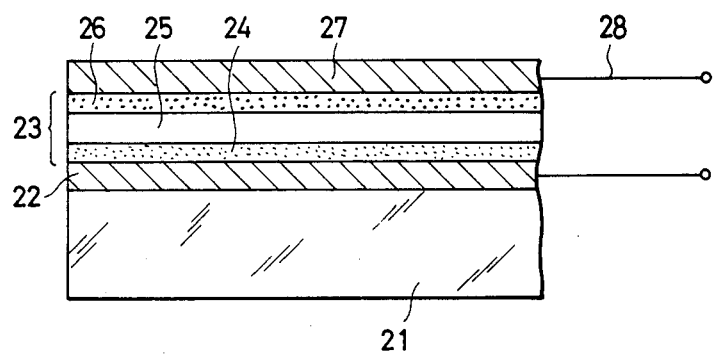
FIG. 2 is a schematic sectional view for illustration of a construction example of a PIN type diode produced by use of the process of the present invention.

FIG. 2 is a schematic illustration showing a typical example of a PIN type diode device utilizing a deposited film of an amorphous material containing silicon, germanium and optionally hydrogen and/or halogen (hereinafter written as "A—SiGe(H,X)") doped with an impurity element, which is prepared by practicing the process of the present invention.

In the drawing, 21 is a substrate, 22 and 27 are thin film electrodes, 23 is a semiconductor film consisting of an n-type a-Si layer 24, an i-type a-Si layer 25 and a p-type a-Si layer 26. 28 is a conductive wire. As the substrate 21, there may be employed a semiconductive material, preferably an insulating material.

These semiconductor layers are constituted of A—Si(H,X,Ge), A—SiGe(H,X), A—Ge(H,X), etc., and the process of the present invention may be applicable for preparation of any of these layers.

As the semiconductive substrate, there may be employed, for example, semiconductors such as Si, Ge, etc. This film electrodes 22, 27 can be obtained by providing thin film of NiCr, Al, Cr, Mo, Au, Ir, Nb, Ta, V, Ti, Pt, Pd, In$_2$O$_3$, SnO$_2$, ITO (In$_2$O$_3$+SnO$_2$), etc. on a substrate by treatment such as the vacuum deposition, electron beam vapor deposition, sputtering methods, etc. The electrodes 22, 27 should have a film thickness preferably of 30 to $5 \times 10^4$ Å, more preferably 100 to $5 \times 10^3$ Å.

For making the film constituting the semiconductor layer 23 of A—SiGe(H,X) n-type or p-type, if desired, it can be formed by doping the layer to be formed with a n-type impurity or a p-type impurity of the impurity elements or both impurities, while controlling its amount.

For formation of n-type, i-type and p-type A—SiGe(H,X) layers, a compound containing silicon and halogen are introduced into the activation space (A) according to the process of the present invention, and these are decomposed by the action of an activation energy, whereby activated, for example, SiF$_2$* can be formed and introduced into the film forming space. Also, separately, a gaseous silicon containing compound and a germanium containing compound, optionally, together with an inert gas, a gas of a compound containing an impurity element as the component, and the like, are excited and decomposed by respective activation energies to form respective activated species, which are then separately or in an appropriate mixture introduced into the activation space (B), to be activated therein to form activated species (B). The activated species (A) and the activated species (B), etc. are introduced into the film forming space wherein the substrate 11 is placed, and, undergo chemical reactions to form a desired deposited film on the substrate 11. The n-type and p-type semiconductor layers should have a layer thickness preferably of 100 to $10^4$ Å, more preferably 300 to 2000 Å.

On the other hand, the i-type semiconductor layer should preferably have a layer thickness of 500 to $10^4$ Å, more preferably 1000 to 10000 Å.

The PIN type diode device shown in FIG. 2 is not necessarily required to prepare all the layers of P, I and N according to the process of the present invention, but the present invention can be practiced by preparing at least one layer of P, I and N according to the process of the present invention.

According to the process for forming a deposited film of the present invention, electrical, optical, photoconductive and mechanical characteristics desired for the film formed can be improved, and yet a high speed film formation becomes possible without maintaining the substrate at a high temperature. Also, reproducibility in film formation can be improved to enable improvement of the film quality and uniformization of the film quality, and the process is also advantageous in enlargement of area of the film and can accomplish easily improvement of productivity of films as well as mass production of films. Further, since no special excitation energy is used during film formation, there can be exhibited such effects that film formation can be effected also on a substrate which is poor in heat resistance, and that the steps can be shortened by a low temperature treatment.

The present invention is described by referring to the following Examples.

EXAMPLE 1

Figure 3:
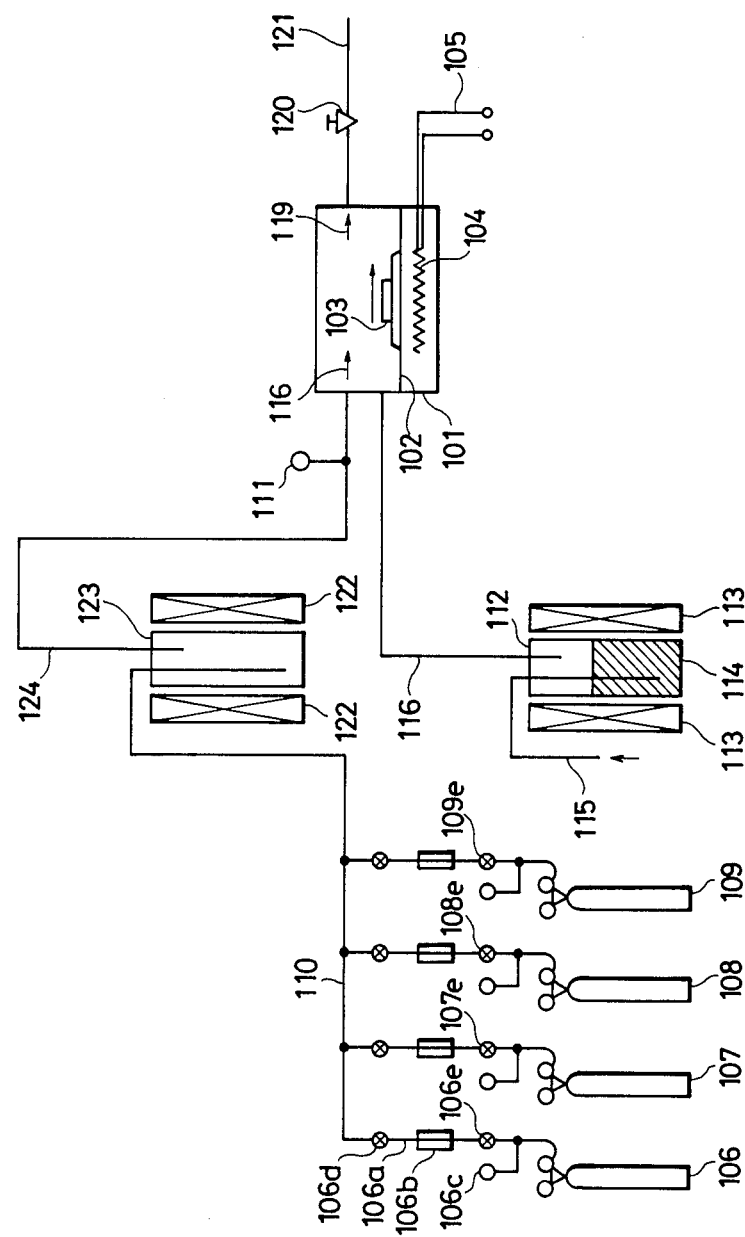
FIGS. 3 and 4 are schematic diagrams for illustration of the constitutions of the devices for practicing the process of the present invention employed in respective examples.

By means of the device as shown in FIG. 3, i-type, p-type, and n-type a-SiGe(H,X) deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. Said heater 104 is used when the substrate 103 is to be heated prior to film formation, or the film after formation is subjected to an annealing treatment for further improvement of the characteristics of the formed film, and said heater 104 is not driven during film formation.

106 through 109 are gas feeding systems, and they are provided corresponding in number to the germanium containing compound, and hydrogen, the halogen compound, inert gases, the silicon containing compound, the carbon containing compound and the compound containing an impurity as the component which are used if desired. Of these gases, when a liquid starting compound is to be used, a suitable gasifying device is provided.

In the drawing, symbols of the gas feeding systems 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is an activation chamber (B) for forming activated species (B), and a microwave plasma generating device 122 which generates activation energy for forming activated species (B) is provided around the activation chamber 123 (B). The starting material for formation of the activated species (B) fed through the gas inflow pipe 110 is activated in the activation chamber (B), and the activated species (B) formed is introduced through the inflow pipe 124 into the film forming chamber 101. 111 is a gas pressure gauge.

In the FIG., 112 shows an activation chamber (A), 113 an electric furnace, 114 solid Si particles and 115 a pipe for introduction of a gaseous compound containing silicon and halogen as the starting material for activated species (A). The activated species formed in the activation chamber (A) 112 is introduced through an inflow pipe 116 into the film forming chamber 101.

In the FIG., 120 shows a gas discharging valve and 121 a gas discharging pipe.

First, a substrate 103 of polyethyleneterephthalate film was placed on a supporting stand 102, and the film forming chamber 101 was evacuated by use of an evacuating device to $10^{-6}$ Torr. From a gas feeding bomb 106, GeH$_4$ at 150 SCCM, or a gas mixture thereof with PH$_3$ gas or B$_2$H$_6$ gas (each being diluted to 1000 ppm with hydrogen gas) at 40 SCCM, was introduced through the gas inflow pipe 110 into the activation chamber (B) 123. The GeH$_4$ gas, etc. introduced into the activation chamber (B) was activated by means of the microwave plasma generating device 122 to be converted to hydrogenated germanium activated species, which were then introduced through the inflow pipe 124 into the film forming chamber 101.

Also, the activation chamber 102 was packed with solid Si particles 114 which were made red-hot by heating with electric furnace 113 and maintained at about 1100° C., whereinto SiF$_4$ was blown through inflow pipe 115 from the bomb not shown, thereby forming activated species of SiF$_2$* as the activated species (A), which were then introduced into the film forming chamber 101 via the inflow pipe 116.

While maintaining the pressure in the film forming chamber 101 at 0.4 Torr, a non-doped or doped A—SiGe(H,X) (film thickness 700 Å) was formed. The film forming speed was 25 Å/sec.

Subsequently, the non-doped or p-type A—SiGe(H,X) film sample was placed in a vacuum deposition tank, wherein a comb-type Al-gap electrode (length 250 $\mu$, width 5 mm) was formed under a vacuum of $10^{-5}$ Torr, and the dark electroconductivity $\sigma_d$ was determined at an application voltage of 10 V for evaluation of A—SiGe(H,X) film. The results are shown in Table 1.

EXAMPLES 2-4

Except for using straight chain Ge$_4$H$_{10}$, branched chain GeH$_4$H$_{10}$ or H$_6$Ge$_6$F$_6$ in place of Si$_5$H$_{10}$, A—SiGe(H,X) films were formed in the same manner as in Example 1. The dark electroconductivities were measured to obtain the results shown in Table 1.

TABLE 1

| Item | Example 1 | Example 2 | Example 3 | Example 4 |
|---|---|---|---|---|
| Germanium compound | GeH$_4$ | straight Ge$_4$H$_{10}$ | branched Ge$_4$H$_{10}$ | H$_6$Ge$_6$F$_6$ |
| $\sigma_d$ (non-doped) ($\Omega \cdot$ cm)$^{-1}$ | $8.0 \times 10^{-8}$ | $7.5 \times 10^{-8}$ | $8.0 \times 10^{-8}$ | $6.0 \times 10^{-8}$ |
| $\sigma_d$ (B doped) ($\Omega \cdot$ cm)$^{-1}$ | $7.1 \times 10^{-7}$ | $6.4 \times 10^{-7}$ | $3.3 \times 10^{-7}$ | $6.4 \times 10^{-7}$ |
| $\sigma_d$ (P doped) ($\Omega \cdot$ cm)$^{-1}$ | $6.8 \times 10^{-6}$ | $5.8 \times 10^{-6}$ | $1.8 \times 10^{-6}$ | $3.7 \times 10^{-6}$ |

From Table 1, it can be seen that A—SiGe(H,X) films with excellent electrical characteristics can be obtained according to the present invention and also that A—SiGe(H,X) films applied with sufficient doping can be obtained.

EXAMPLE 5

Figure 4:
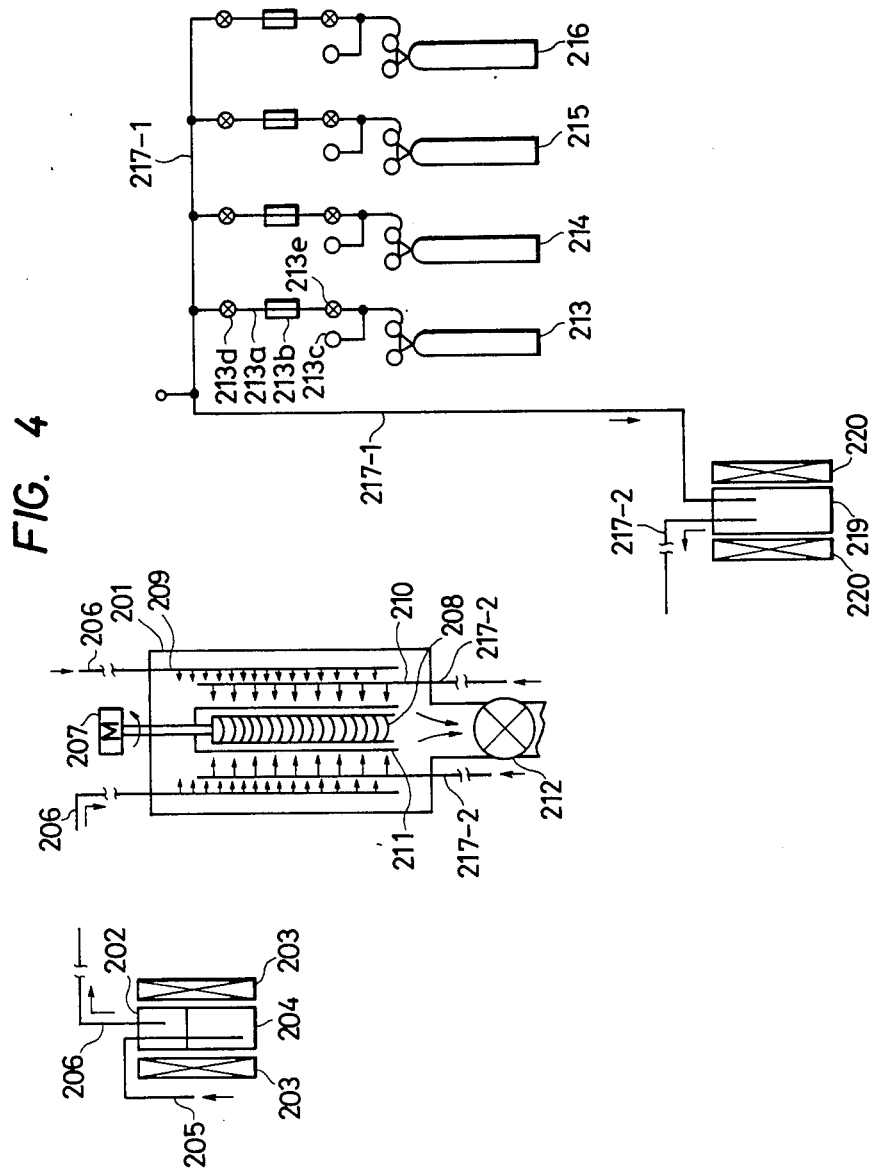

By means of the device as shown in FIG. 4, a drum-shaped image forming member for electrophotography with a layer constitution as shown in FIG. 1 was prepared according to the operations as described below.

In FIG. 4, 201 shows a film forming chamber, 202 an activation chamber (A), 203 an electric furnace, 204 solid Si particles, 205 a pipe for introducing the starting material of activated species (A), 206 a pipe for introducing activated species (A), 207 a motor, 208 a heater which is used in the same manner as the heater 104 in FIG. 3, 209 and 210 blowing pipes, 211 an aluminum cylinder substrate and 212 a gas discharging valve. 213 through 216 are starting gas feeding systems similarly as 106 through 109 in FIG. 1, and 217-1 is a gas inflow pipe.

In the film forming chamber 201, the aluminum cylinder 211 is suspended, equipped internally thereof with the heater 208 so as to rotatable with the motor 207.

Also, the activation chamber (A) 202 was packed with solid Si particles 204 which were made red-hot by heating with the electric furnace and maintained at about 1100° C., whereinto $SiF_4$ was blown to form activated species of $SiF_2^*$ as the activated species (A), and said $SiF_2^*$ was introduced into the film forming chamber 201 via the inflow pipe 206.

On the other hand, through the inflow pipe 217-1, respective gases of $Si_2H_6$, $GeH_4$ and $H_2$ were introduced into the activation chamber (B) 219. $Si_2H_6$, $GeH_4$ and $H_2$ gases introduced were subjected to the activation treatment with plasma, etc. by the microwave plasma generating device 220 in the activation chamber (B) 219 to be converted to hydrogenated silicon activated species, hydrogenated germanium activated species, activated hydrogen, etc, and introduced through the inflow pipe 217-2 into the film forming chamber 201. During this operation, impurity gases such as $PH_3$, $B_2H_6$, etc. may be also introduced, if desired, into the activation chamber (B) 220 to be activated. The inner pressure within the film forming space 201 was maintained at 1.0 Torr.

The aluminum cylinder substrate 211 was rotated, while the discharging gas was discharged through the discharging valve 212. Thus, a photosensitive layer 13 was formed.

Also, the intermediate layer 12 was formed to a film thickness of 2000 Å by introducing a gas mixture of $Si_2H_6$, $GeH_4$, $H_2$ and $B_2H_6$ (0.2% of $B_2H_6$ in terms of vol. %) through the inflow pipe 217-1 prior to the formation of the photosensitive layer.

COMPARATIVE EXAMPLE 1

According to the plasma CVD method in general, an image forming member for electrophotography shaped in a drum having a layer constitution as shown in FIG. 1 was formed by use of respective gases $SiF_4$, $Si_2H_6$, $GeH_4$, $H_2$ and $B_2H_6$ in the same film forming chamber as the film forming chamber 201 provided with a high frequency means of 13.56 MHz.

The conditions for preparation of the drum-shaped image forming members for electrophotography obtained in Example 5 and Comparative example 1 and their performances are shown in Table 2.

TABLE 2

| Item | Example 5 | Comparative example 1 |
|---|---|---|
| Starting gas for formation of activated species (A) | $SiF_4$ | |
| Activation temperature | 1100° C. | |
| Main activated species formed | $SiF_2^*$ | |
| Starting gas for formation of activated species (B) | $Si_2H_6$/ $GeH_4$/$H_2$ | |
| Inflow from activation chamber (A) | 200 SCCM | |
| Inflow from activation chamber (B) | 100 SCCM | |
| Inflow from starting gas bomb | | $SiF_4$ 200 SCCM $Si_2H_6$ 100 SCCM $GeH_4$ 50 SCCM $H_2$ 100 SCCM |
| Inner pressure in film forming chamber | 1.0 Torr | 1.0 Torr |
| Film forming speed | 14 Å/sec | 3 Å/sec |
| RF discharging power | | 1.8 W/cm² |
| Layer thickness of photosensitive layer 13 | 20μ | 20μ |
| Average number of image defects in 10 drum-shaped image forming members for electrophotography | 4 | 20 |
| Receptor potential irregularity in circumferential direction | ±7 V | ±35 V |
| Receptor potential irregularity in generant direction | ±16 V | ±40 V |
| Remarks | Example according to the process of the invention | Example according to plasma CVD of prior art Substrate temperature 250° C. |

EXAMPLE 6

By using $GeH_4$ as the germanium containing compound and the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, activated species of $SiF_2^*$ from the inflow pipe 116, $Si_3H_6$ gas at 150 SCCM, $GeH_4$ at 50 SCCM and $PH_3$ (diluted to 1000 ppm with hydrogen) were introduced respectively from the inflow pipe 110 into the activation chamber (B) 123 to be activated therein.

Next, the activated gases were introduced through the inflow pipe 116 into the film forming chamber maintained at a pressure of 0.4 Torr to form a n-type A—SiGe(H,X) film 24 (film thickness: 700 Å) doped with P.

Next, in the same manner as in the case of the n-type A—SiGe(H,X) except for introducing $B_2H_6$ gas (diluted to 300 ppm with hydrogen gas) in place of $PH_3$ gas, i-type A—SiGe(H,X) film 25 (film thickness: 5000 Å) was formed.

Subsequently, by use of $B_2H_6$ gas (diluted to 1000 ppm with hydrogen) in place of $PH_3$ gas, following otherwise the same conditions as in the case of n-type, a p-type A-SiGe(H,X) film 26 (film thickness: 700 Å)

doped with B was formed. On this p-type film was formed by the vapor deposition an aluminum electrode 27 with a thickness of 1000 Å to provide a PIN type diode.

The diode element thus obtained (area 1 cm$^2$) was subjected to the measurement of I-V characteristic, and rectifying characteristic and photovoltaic effect were evaluated. The results are shown in Table 3.

Also, in photoirradiation characteristics, light was introduced from the substrate side, and a conversion efficiency of 6.9% or higher, an open end voltage of 0.72 V and a short circuit current of 9 mA/cm$^2$ were obtained at a photoirradiation intensity AMI (about 100 mW/cm$^2$).

EXAMPLES 7-9

Except for using straight chain Ge$_4$H$_{10}$, branched chain Ge$_4$H$_{10}$ or H$_6$Ge$_6$F$_6$ as the germanium containing compound, the same PIN type diode as in Example 6 was prepared. The rectifying characteristic and photovoltaic effect were evaluated and the results are shown in Table 3.

TABLE 3

| Item | Example 6 | Example 7 | Example 8 | Example 9 |
|---|---|---|---|---|
| Germanium containing compound | GeH$_4$ | straight Ge$_4$H$_{10}$ | branched Ge$_4$H$_{10}$ | H$_6$Ge$_6$F$_6$ |
| Rectifying ratio of diode (*1) | 6 × 10$^2$ | 4 × 10$^2$ | 5 × 10$^2$ | 1 × 10$^2$ |
| n value of diode (*2) | 1.3 | 1.4 | 1.4 | 1.4 |

(*1) Ratio of current in normal direction to current in opposite direction at voltage of 1 V
(*2) n value (Quality Factor) in the current formula of p-n junction:

$$J = J_s \left\{ \exp\left(\frac{ev}{nRT}\right) - 1 \right\}$$

From Table 3, it can be seen that A—SiGe(H,X) PIN type diode having better optical and electrical characteristics as compared with the prior art can be obtained according to the present invention.

We claim:

1. A process for forming a deposited film comprising separately introducing an activated species (A) and an activated species (B) into a film forming space for forming a deposited film on a substrate, said activated species (A) being formed by decomposing a compound containing silicon and a halogen; and said activated species (B) being formed by decomposing a germanium containing compound for film formation which is chemically mutually reactive with said activated species (A); and permitting both activated species (A) and activated species (B) to react chemically with each other thereby to form a deposited film on the substrate.

2. A process according to claim 1, wherein said germanium compound is selected from the group consisting of:

(a) hydrogenated germanium compounds represented by

Ge$_a$H$_b$ wherein a is an integer of 1 or more and b=2a+2, and

Ge$_a$H$_b$ wherein a is as defined above and b is 2a;

(b) polymers of said hydrogenated germanium compounds;

(c) partially and wholly halogen substituted said hydrogenated germanium compounds; and (d) compounds of said hydrogenated germanium compounds in which a part or all of the hydrogen atoms are substituted by groups selected from the group consisting of alkyl groups aryl groups and halogen atoms.

3. A process according to claim 1, wherein said compound containing silicon and a halogen is selected from the group consisting of:

(a) chain silicon halides represented by

Si$_u$Y$_{2u+2}$ wherein u is an integer of 1 or more, and Y is selected from the group consisting of F, Cl, Br, I and mixtures thereof;

(b) cyclic silicon halides represented by

Si$_v$T$_{2v}$ wherein v is an integer of 3 or more, and Y is as defined above;

(c) chain silicon compounds represented by

Si$_u$H$_x$Y$_y$ wherein u and Y are as defined above, and $x+y = 2u+2$; and (d) cyclic silicon compounds represented by Si$_u$H$_x$Y$_y$ wherein u and Y are as defined above and $x+y=2u$.

4. A process according to claim 1, wherein activated species (a) and said activated species (B) are introduced into the film forming space in a ratio ranging from 10:1 to 1:10.

5. A process according to claim 1, further comprising introducing into the film forming space at least one starting compound selected from the group consisting of hydrogen gas, halogen compounds, inert gases, silicon containing compounds, and carbon containing compounds.

6. A process according to claim 1, further comprising introducing into the film forming space an active species (PN) for introducing an impurity element into the deposited film; said active species (PN) being formed by activating a compound containing said impurity element.

7. A process according to claim 6, wherein said compound containing said impurity element is selected from the group consisting of PH$_3$, P$_2$H$_4$, PF$_3$, PF$_5$, PCl$_3$, AsH$_3$, AsF$_3$, AsF$_5$, AsCl$_3$, SbH$_3$, SbF$_5$, SbF$_3$, BF$_3$, BCl$_3$, BBr$_3$, B$_2$H$_6$, B$_4$H$_{10}$, B$_5$H$_9$, B$_5$H$_{11}$, B$_6$H$_{10}$, B$_6$H$_{12}$, and AlCl$_3$.

8. A process according to claim 1, wherein said germanium containing compound is selected from the group consisting of GeH$_4$, Ge$_2$H$_6$, Ge$_3$H$_8$, n-Ge$_4$H$_{10}$, tert-Ge$_4$H$_{10}$, Ge$_3$H$_6$, Ge$_5$H$_{10}$, GeH$_3$F, GeH$_3$Cl, GeH$_2$F$_2$, H$_6$Ge$_6$F$_6$, Ge(CH$_3$)$_4$, Ge(C$_2$H$_5$)$_4$, Ge(C$_6$H$_5$)$_4$, $CH_3GeH_3$, $(CH_3)_2GeH_2$, $(CH_3)_3GeH$, $(C_2H_5)_2GeH_2$, $Ge(CH_3)_2F$, $GeF_2$, $GeF_4$, $GeS$, and mixtures thereof.

9. A process according to claim 1, wherein said compound containing silicon and a halogen is selected from the group consisting of $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and mixtures thereof.

10. A process according to claim 5 wherein said starting compound is a straight-chain silane compound.

11. A process according to claim 10, wherein said straight-chain silane compound is selected from the group consisting of $SiH_4$, $Si_2H_6$, $Si_3H_8$, $Si_4H_{10}$, $Si_5H_{12}$, $Si_6H_{14}$, and mixtures thereof.

12. A process according to claim 5, wherein said starting compound is a branched-chain silane compound.

13. A process according to claim 12, wherein said branched-chain silane compound is selected from the group consisting of $SiH_3SiH(SiH_3)SiH_3$, $SiH_3SiH(SiH_3)Si_3H_7$, $Si_2H_5SiH(SiH_3)Si_2H_5$, and mixtures thereof.

14. A process according to claim 5, wherein said starting compound is a cyclic silane compound.

15. A process according to claim 14, wherein said cyclic silane compound is selected from the group consisting of $Si_3H_6$, $Si_4H_8$, $Si_5H_{10}$, $Si_6H_{12}$, and mixtures thereof.

16. A process according to claim 5, wherein said starting compound is a carbon containing compound selected from the group consisting of methane, ethane, propane, n-butane, pentane, ethylene, propylene, butene-1, butene-2, isobutylene, pentene, acetylene, methylacetylene and butyne.

* * * * *

UNITED STATES PATENT AND TRADEMARK OFFICE
CERTIFICATE OF CORRECTION

PATENT NO. : 4,717,586

DATED : January 5, 1988

INVENTOR(S) : SHUNICHI ISHIHARA, ET AL.

Page 1 of 2

It is certified that error appears in the above-identified patent and that said Letters Patent is hereby corrected as shown below:  Title page:

AT [56] IN THE REFERENCES

U.S. Patent Documents,
"4,521,447   6/1985   Oushinsky et al. ..... 427/38"
should read
--4,521,447   6/1985   Ovshinsky et al. ..... 427/38--.
"4,522,663   6/1985   Oushinsky et al. ..... 427/86"
should read
--4,522,663   6/1985   Ovshinsky et al. ..... 427/86--.

COLUMN 1

Line 17, "the optical and" should read --and the optical--.

COLUMN 4

Line 3, "creading" should read --cluding--.

COLUMN 5

Line 4, "B," should read --(B),--.

COLUMN 6

Line 41, "treament" should read --treatment--.

COLUMN 8

Line 36, "This" should read --Thin--.

UNITED STATES PATENT AND TRADEMARK OFFICE
CERTIFICATE OF CORRECTION

PATENT NO. : 4,717,586

DATED : January 5, 1988

INVENTOR(S) : SHUNICHI ISHIHARA, ET AL.

It is certified that error appears in the above-identified patent and that said Letters Patent is hereby corrected as shown below:

COLUMN 14

Line 11, "groups aryl" should read --groups, aryl--.
Line 41, "activated" should read --said activated--.
Line 42, "(a)" should read --(A)--.

COLUMN 15

Line 9, "claim 5" should read --claim 5,--.

Signed and Sealed this

Twentieth Day of September, 1988

Attest:

DONALD J. QUIGG

*Attesting Officer*  *Commissioner of Patents and Trademarks*